(12) United States Patent
Williamson et al.

(10) Patent No.: US 7,557,345 B2
(45) Date of Patent: Jul. 7, 2009

(54) INTEGRATED CIRCUIT CHIPS, APPARATUSES FOR OBTAINING BACKSCATTER DATA FROM SAMPLES, METHODS OF BACKSCATTER ANALYSIS, AND METHODS OF FORMING ALPHA PARTICLE EMISSION AND DETECTION SYSTEMS

(75) Inventors: Mark Williamson, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 11/787,852

(22) Filed: Apr. 18, 2007

(65) Prior Publication Data

US 2008/0258057 A1 Oct. 23, 2008

(51) Int. Cl.
*G01N 23/00* (2006.01)
(52) U.S. Cl. .................................................. 250/308
(58) Field of Classification Search .................. 250/308, 250/83, 71, 65; 257/428, 429, 781; 438/7
See application file for complete search history.

(56) References Cited

U.S. PATENT DOCUMENTS

| | | | | |
|---|---|---|---|---|
| 3,665,194 | A * | 5/1972 | Alter et al. | 250/253 |
| 4,785,186 | A * | 11/1988 | Street et al. | 250/370.14 |
| 6,545,330 | B1 * | 4/2003 | Bernstein et al. | 257/428 |
| 2004/0232345 | A1 * | 11/2004 | Jagam et al. | 250/370.02 |
| 2007/0013073 | A1 * | 1/2007 | Cabral et al. | 257/758 |

OTHER PUBLICATIONS

Walsh, D.S.; Doyle, B.L. "Simultaneous Nuclear Reaction Analysis of Boron and Phosphorus in Thin Borophosphosilicate Glass Films Using (A,P) Reactions" Jun. 22, 1999 http://www.osti.gov/energycitations/servlets/purl/9570-r44mbi/webviewable.

"Ion Implantation" http://www.phy.anl.gov 1 page, prior to Feb. 20, 2007.

Wei-Kan Chu, "Rutherford Backscattering Spectrometry" Department of Physics and Astronomy, University of North Carolina pp. 628-630.

Nikolic, R.J., et al. "Roadmap for High Efficiency Solid-State Neutron Detectors" Lawrence Livermore National Laboratories Jul. 14, 2005.

* cited by examiner

*Primary Examiner*—David P Porta
*Assistant Examiner*—Kiho Kim
(74) *Attorney, Agent, or Firm*—Wells St. John P.S.

(57) ABSTRACT

Some embodiments include methods for fabricating an alpha particle emitter and detector associated with an integrated circuit chip. Some embodiments include an integrated circuit chip comprising an alpha particle emitter and detector supported by a semiconductor substrate. Some embodiments include an apparatus for obtaining backscatter data from a sample utilizing an alpha particle emission and detection system supported by a semiconductor substrate. Some embodiments include methods of backscatter analysis utilizing a semiconductor substrate containing an alpha particle emitter and an alpha particle sensor.

32 Claims, 6 Drawing Sheets

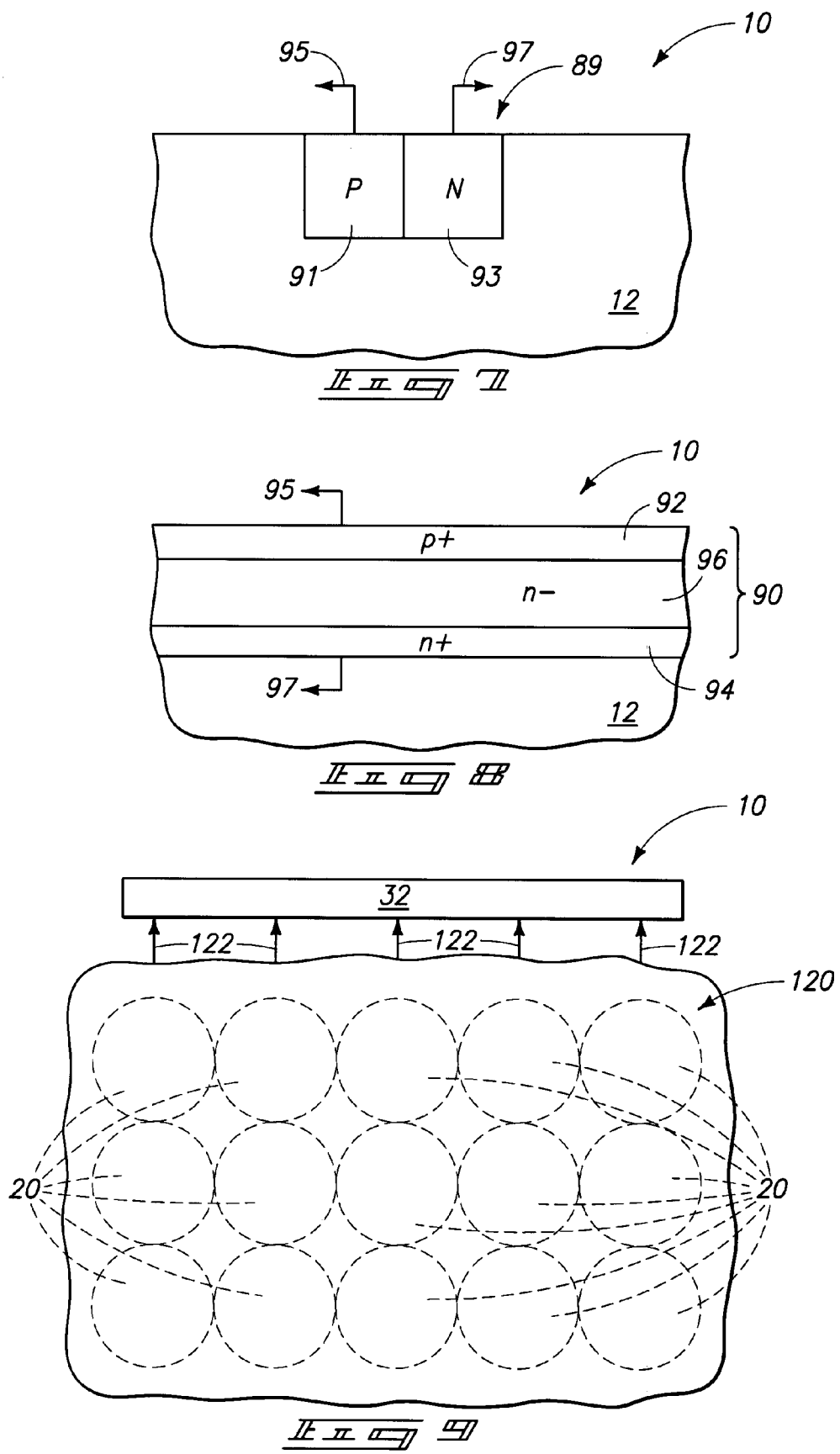

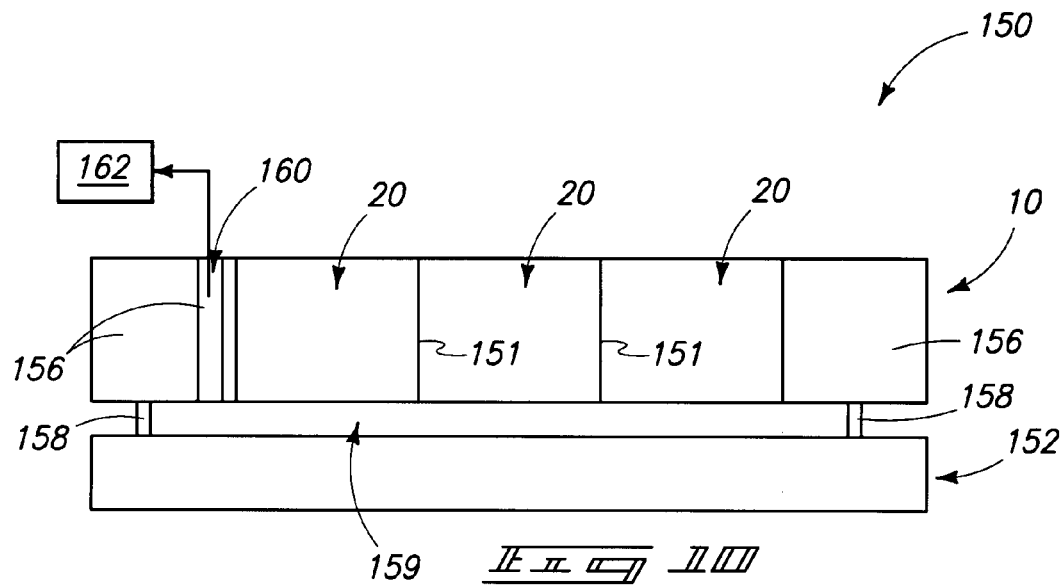
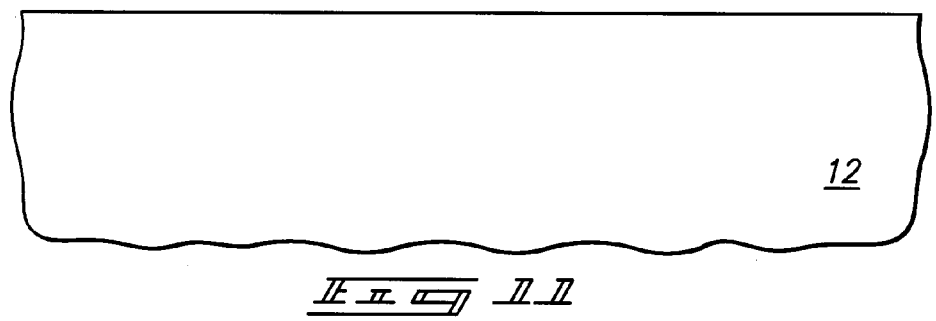
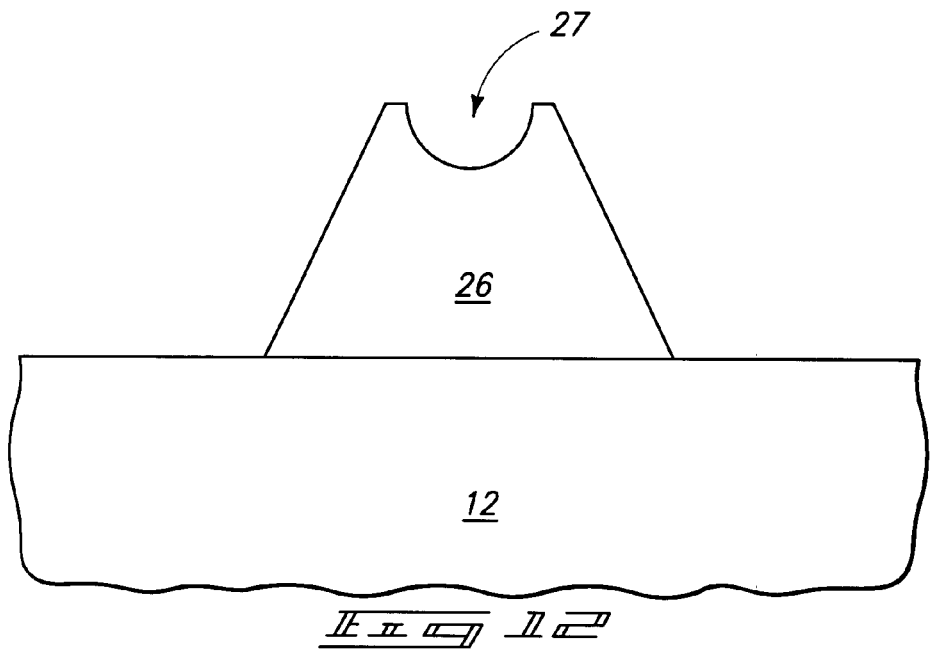

US 7,557,345 B2

INTEGRATED CIRCUIT CHIPS, APPARATUSES FOR OBTAINING BACKSCATTER DATA FROM SAMPLES, METHODS OF BACKSCATTER ANALYSIS, AND METHODS OF FORMING ALPHA PARTICLE EMISSION AND DETECTION SYSTEMS

TECHNICAL FIELD

Integrated circuit chips, apparatuses for obtaining backscatter data from samples, methods of backscatter analysis, and methods of forming alpha particle emission and detection systems.

BACKGROUND

Rutherford backscattering (RBS) is utilized for obtaining information about surfaces and compositions. The technique comprises directing alpha particles toward a Surface, followed by measurement of properties of alpha particles backscattered from the surface. The measured properties may include, for example, the proportion of alpha particles backscattered, the energy of the backscattered particles, and/or the direction of travel of the backscattered particles.

RBS may be used in the semiconductor industry for quality control analyses. For instance, Rutherford backscattering may be used for determining film stoichiometries, for determining dopant levels within layers, for determining layer thicknesses, etc.

Systems utilized for RBS have an alpha particle source, and one or more detectors configured for detecting backscattered alpha particles. A problem with the systems is that they tend to be large and expensive. It would be desirable to develop new systems suitable for the alpha particle emission and detection of RBS analysis, which are smaller and less expensive than conventional devices.

BRIEF DESCRIPTION OF THE DRAWINGS

FIG. 7 is a diagrammatic cross-sectional side view of an alpha particle detector in accordance with an embodiment.

FIG. 8 is a diagrammatic cross-sectional side view of an alpha particle detector in accordance with an embodiment.

FIG. 9 is a diagrammatic top view of an integrated circuit chip containing an array of alpha particle emitters and detectors in accordance with an embodiment.

FIG. 10 is a diagrammatic view of an apparatus for conducting Rutherford backscattering analysis in accordance with an embodiment.

FIGS. 11-14 illustrate stages of a method for fabricating an alpha particle emitter, detector and shield in accordance with an embodiment.

DETAILED DESCRIPTION OF THE ILLUSTRATED EMBODIMENTS

Some embodiments include compact Rutherford backscattering systems. The systems include unit cells comprising alpha particle emitters, alpha particle sensors, and shields between the emitters and sensors. The unit cells may also include a magnetic lens system for focusing alpha particles emitted from the emitters. The unit cells may be incorporated into integrated circuit chips, with individual chips comprising a large number of the unit cells arranged as an array. The individual unit cells within the array may be less than five microns wide along a maximal direction, less than two microns wide, or less than 200 nanometers wide in some embodiments.

Figure 1:
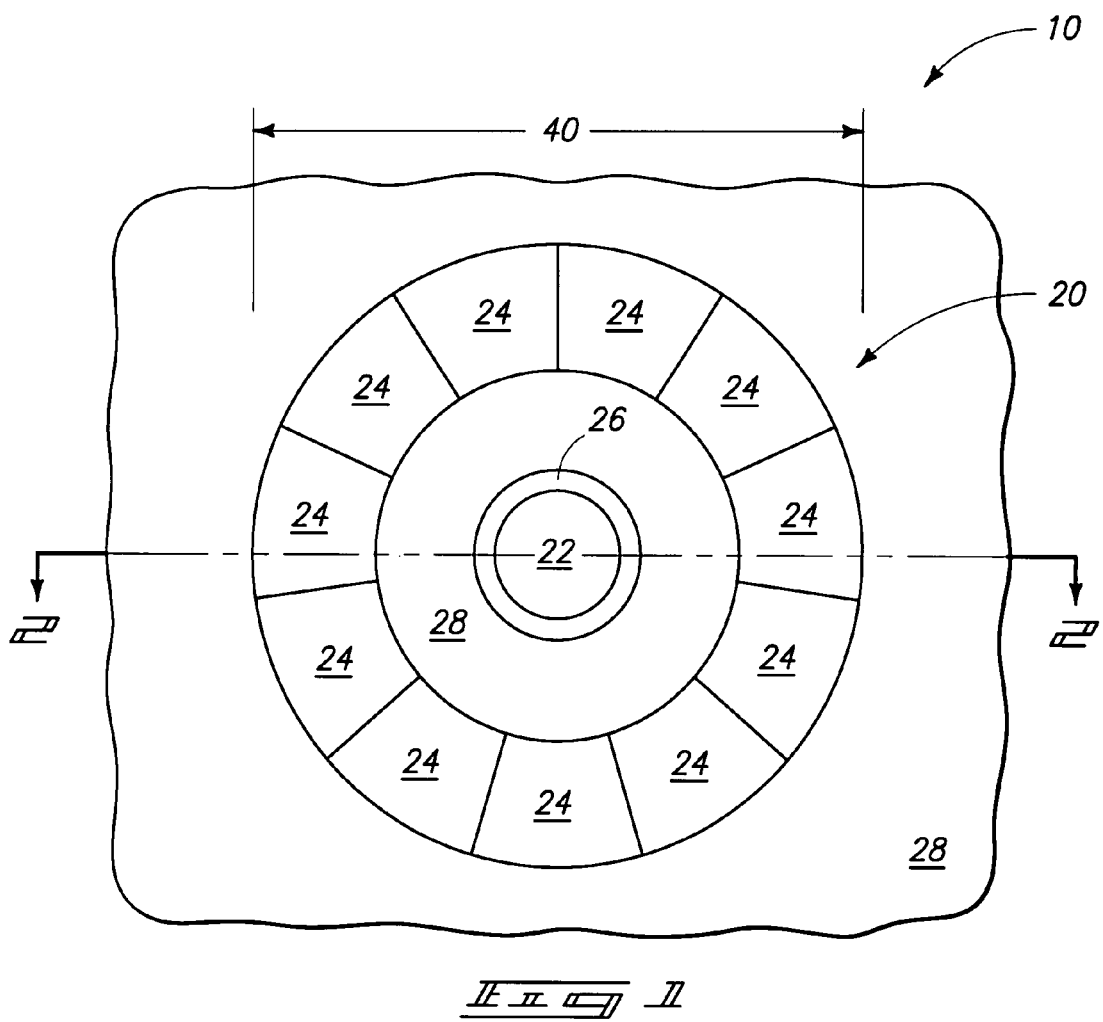
FIGS. 1 and 2 are a diagrammatic top view, and diagrammatic cross-sectional side view, respectively, of a portion of an integrated circuit chip in accordance with an embodiment.
Figure 2:
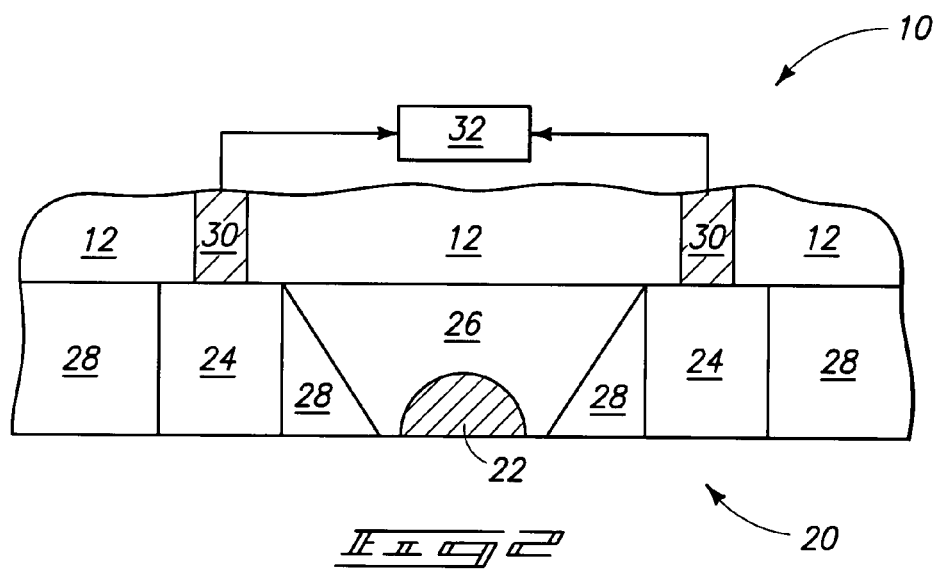

FIGS. 1 and 2 show a portion of an integrated circuit chip 10 comprising a compact Rutherford backscattering system 20. FIG. 2 is inverted relative to FIG. 1 so that the top view of FIG. 1 is along the bottom of FIG. 2.

The integrated circuit chip 10 includes a semiconductor base 12. The base may comprise, consist essentially of, or consist of any suitable semiconductor material, such as, for example, monocrystalline silicon. To aid in interpretation of the claims that follow, the terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, it is to be understood that the base may comprise numerous layers in some embodiments. For instance, base 12 may correspond to a semiconductor substrate containing one or more layers associated with integrated circuit fabrication. In such embodiments, the layers may correspond to one or more of metal interconnect layers, barrier layers, diffusion layers, insulator layers, etc.

The Rutherford backscattering system 20 comprises an alpha particle emitter 22, alpha particle detectors (or sensors) 24 arranged radially around the emitter, and a shield 26 between the emitter and the detectors.

The alpha particle emitter 22 may comprise any radioactive material that emits alpha particles, and may, for example, comprise, consist essentially of, or consist of one or both of radium and americium. In some embodiments, the radioactive material utilized for the alpha particle emitter has a half-life of at least about two years so that the material remains usable for several years.

The alpha particle detectors 24 are shown diagrammatically in FIG. 1, and may comprise any integrated circuitry that undergoes a detectable change upon exposure to alpha particles. For instance, the alpha particle detectors may comprise planar PIN-type detectors (where PIN-type detectors are semiconductor detectors consisting of a depletion region between a p-type region and an n-type region). A single RBS PIN-type detector may be utilized for each of the diagrammatically illustrated detectors 24, or multiple PIN-type detectors may be stacked in one or more pillars for each of the diagrammatically illustrated detectors (or sensors) 24 to increase sensitivity. In some embodiments, detectors 24 may comprise transistors, capacitors, or dynamic random access memory (DRAM) unit cells.

The shield 26 blocks alpha particles emitted from emitter 22 from directly passing into alpha particle detectors 24. The shield may comprise any suitable composition or combination of compositions, and may, for example, comprise, consist essentially of, or consist of one or both of gold and platinum.

A fill material 28 is provided within gaps between the alpha particle detectors 24 and the shield 26, and within gaps on an opposing side of the detectors from the shield. The fill material may comprise any suitable composition or combination of compositions, and may, for example, comprise silicon dioxide. In some embodiments, the fill material may be omitted from some or all of the gaps.

FIG. 2 shows electrical interconnects 30 extending from the alpha particle detectors 24 and through base 12. The electrical interconnects may comprise any suitable composition or combination of compositions, and may, for example, comprise, consist essentially of, or consist of one or more of metal, metal-containing compositions, and conductively-doped semiconductor compositions.

The electrical interconnects are in electrical connection with a processor 32. The processor 32 may be comprised by integrated circuitry associated with chip 12, or may be comprised by a component separate from the integrated circuit chip.

In operation, alpha particles are directed from emitter 22 toward a sample (not shown in FIGS. 1 and 2), and backscattered alpha particles impact one or more of the detectors 24 to alter electrical properties of the detectors. Information regarding the altered electrical properties passes through conductive interconnects 30 to processor 32. The processor generates data from such information. The data may describe, for example, the topography and/or composition of a region of the sample. Such data may be utilized to determine if the sample meets expected standards of quality and/or may be output to a display where it can be observed and interpreted by a person.

The system 20 of FIG. 1 may be considered a unit cell comprising an alpha particle emitter and a plurality of alpha particle detectors radially arranged around the emitter. Such unit cell is radially symmetric (in other words, circular) in the top view of FIG. 1, and has a diameter 40. The diameter may be less than or equal to about five microns, less than or equal to about three microns, less than or equal to about one micron, and in some embodiments less than or equal to about 500 nanometers, or less than or equal to about 100 nanometers. Thus, the unit cell may be very compact and may utilize only a small amount of the semiconductor real estate of base 12. The amount of semiconductor real estate consumed by the circular unit cell of FIG. 1 will be pi*radius $^2$ (i.e., $\pi r^2$), and may, for example, be less than or equal to about 20 microns$^2$, less than or equal to about 10 microns$^2$, less than or equal to about 5 microns$^2$, less than or equal to about 1 micron$^2$, less than or equal to about 40,000 nm$^2$, less than or equal to about 32,000 nm$^2$, less than or equal to about 10,000 nm$^2$, or less than or equal to about 8000 nm$^2$. In some embodiments, the system 20 of FIG. 1 may be considered to have a maximal cross-section over base 12 corresponding to a cross-section which covers a maximal amount of real estate of base 12. Such maximal cross-section may comprise the dimensions discussed above regarding the amount of semiconductor real estate consumed by the unit cell.

Figure 3:
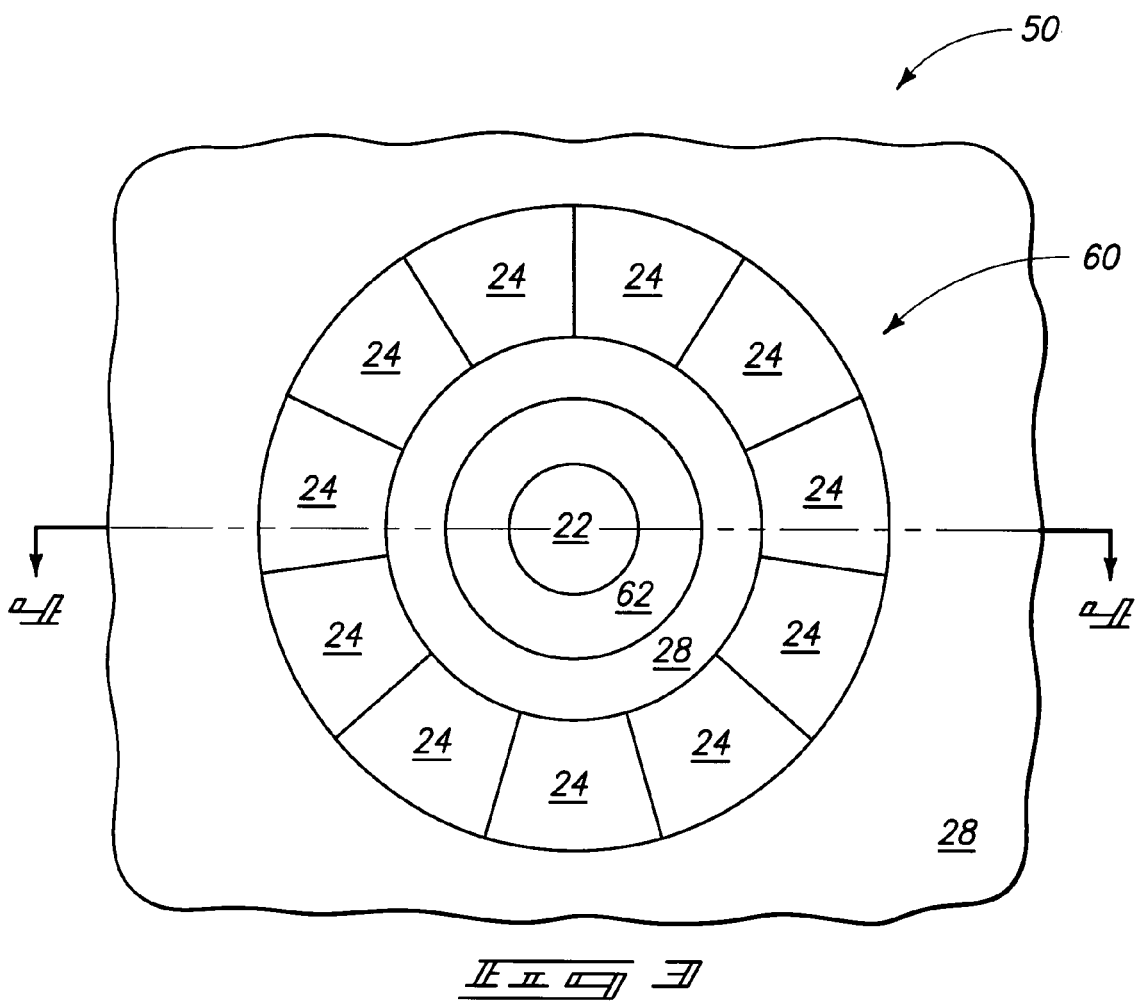
FIGS. 3 and 4 are a diagrammatic top view, and diagrammatic cross-sectional side view, respectively, of a portion of an integrated circuit chip in accordance with an embodiment.
Figure 4:
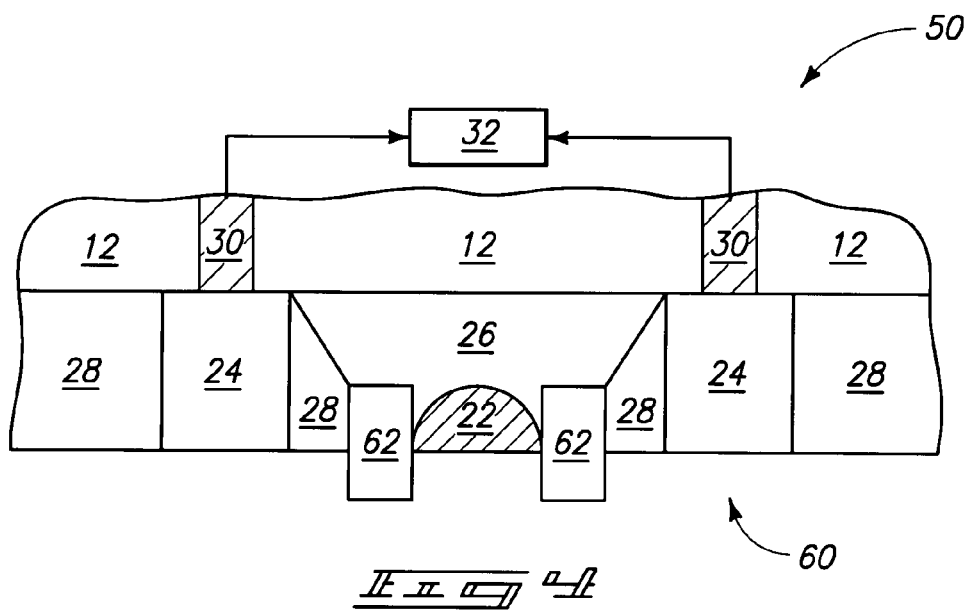

FIGS. 3 and 4 show another embodiment of a Rutherford backscattering system, and specifically show a portion of an integrated circuit chip 50 comprising a compact Rutherford backscattering system 60. Similar numbering will be utilized in referring to FIGS. 3 and 4 as is used above in referring to FIGS. 1 and 2, where appropriate. FIG. 4 is inverted relative to FIG. 3 so that the top view of FIG. 3 is along the bottom of FIG. 4.

The chip 50 comprises the base 12, interconnects 30, and fill material 28 discussed previously, and the interconnects 30 are in electrical connection with the processor 32 discussed above. The Rutherford backscattering system 60 comprises the alpha particle emitter 22, alpha particle detectors 24, and shield 26 discussed above. In addition, the system 60 comprises a magnetic lens 62 configured for focusing alpha particles emitted from the emitter 22. The magnetic lens may comprise material that is permanently magnetic, or may comprise material that is electromagnetic and in electrical connection with circuitry (not shown) integrated within chip 12 for controlling magnetism of the electromagnetic material. The focusing of the alpha particles may provide some control over the directionality of the alpha particles emitted toward a sample, and/or may provide some control over the velocity of the alpha particles emitted toward a sample.

Figure 5:
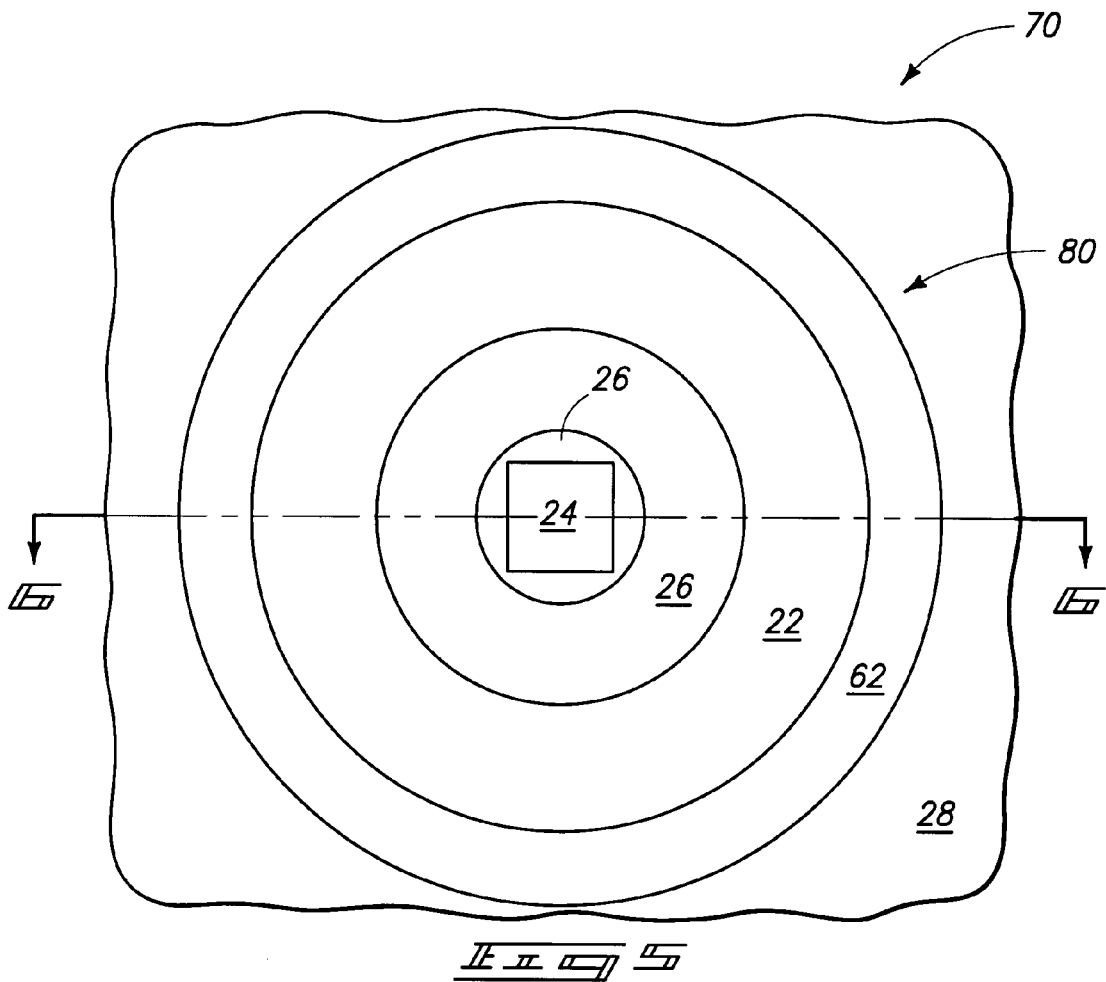
FIGS. 5 and 6 are a diagrammatic top view, and diagrammatic cross-sectional side view, respectively, of a portion of an integrated circuit chip in accordance with an embodiment.
Figure 6:
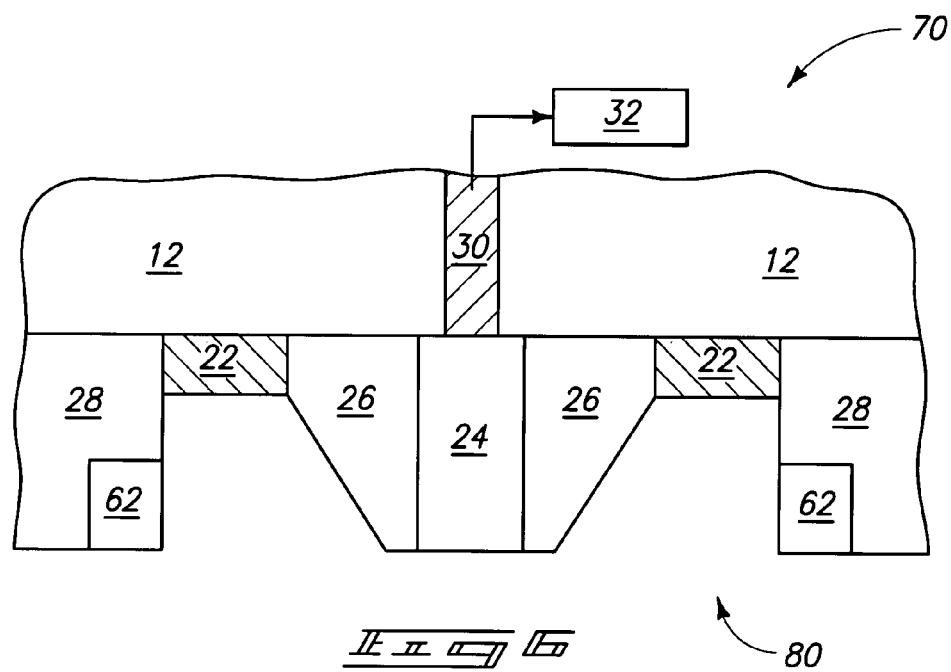

FIGS. 5 and 6 show another embodiment of a Rutherford backscattering system, and specifically show a portion of an integrated circuit chip 70 comprising a compact Rutherford backscattering system 80. Similar numbering will be utilized in referring to FIGS. 5 and 6 as is used above in referring to FIGS. 1-4, where appropriate. FIG. 6 is inverted relative to FIG. 5 so that the top view of FIG. 5 is along the bottom of FIG. 6.

The Rutherford backscattering system 80 comprises an alpha particle emitter 22, an alpha particle detector 24, and a shield 26 similar to those discussed above. However, in contrast to the systems of FIGS. 1-4, the system 80 comprises the alpha particle emitter 22 surrounding the alpha particle detector. Although a single alpha particle detector is shown, in other embodiments multiple alpha particle detectors may be within the central region and surrounded by the alpha particle emitter.

The system 80 comprises a magnetic lens 62 similar to that of FIGS. 3 and 4, but the magnetic lens of system 80 is supported by fill material 28, while the magnetic lens of the system of FIGS. 3 and 4 is supported by the shield.

The system 80 may be radially symmetric similar to the systems of FIGS. 1-4.

The integrated circuit chip 70 of FIGS. 5 and 6 comprises the base 12 described previously, and comprises a single interconnect 30 extending through the base to the detector 24. Such interconnect is an electrical connection with a processor 32.

As discussed previously, the alpha particle detectors 24 may comprise any integrated circuitry which changes in detectable properties upon being exposed to alpha particles, and may, for example, comprise PIN-type detectors, or P/N junction diodes. FIG. 7 illustrates an example of a P/N junction diode detector, and FIG. 8 illustrates an example of a PIN-type detector.

Referring to FIG. 7, such shows an example of an alpha particle detector 24 configured as a P/N junction. In referring to FIG. 7, similar numbering will be used as is utilized above in describing FIGS. 1 and 2, where appropriate. The construction of FIG. 7 is a portion of an integrated Circuit chip, and is shown in an inverted orientation relative to the orientation of FIG. 2.

The chip 10 of FIG. 7 comprises the base 12, and comprises a P/N junction 89 in the base. The P/N junction comprises a p-type doped region 91 and an n-type doped region 93. The p-type doped region and n-type doped region are connected to interconnects 95 and 97, respectively, which connect the regions to other circuitry, such as, for example, one or more microprocessors. The interconnects may attach to a surface of the P/N junction, as shown, or may extend through the substrate.

Referring to FIG. 8. Such shows an example of an alpha particle detector 24 configured as a PIN-type detector. In referring to FIG. 8, similar numbering will be used as is utilized above in describing FIGS. 1 and 2, where appropriate. The construction of FIG. 8 is a portion of an integrated circuit chip, and is shown in an inverted orientation relative to the orientation of FIG. 2.

The chip 10 of FIG. 8 comprises the base 12, and comprises a PIN-type detector 90 in the base. The PIN-type detector comprises a heavily doped p-type region (i.e., a p+ region) 92, a heavily doped n-type region (i.e., an n+ region) 94, and a lightly doped n-type region (i.e., an n− region) 96 between the regions 92 and 94. The heavily doped regions may comprise dopant concentrations in excess of $10^{-20}$ atoms/cm$^3$ and the lightly doped region may comprise to a dopant concentration less than $10^{-18}$ atoms/cm$^3$. The regions 92 and 94 are connected to interconnects 95 and 97, respectively, which connect the regions to other circuitry, such as, for example, one or more microprocessors.

The P/N junction of FIG. 7 and PIN-type detector of FIG. 8 are examples of alpha particle sensors, and other configurations of P/N junctions and PIN structures, and/or other types of sensors may be utilized in other embodiments.

The Rutherford backscattering systems 20, 60 and 80 of FIGS. 1-6 may be considered unit cells, and multiple unit cells may be formed as an array across an integrated circuit chip. For example, FIG. 9 illustrates an integrated circuit chip 10 comprising an array 120 of Rutherford backscattering systems 20 (with individual systems 20 being unit cells of the array, and being diagrammatically illustrated in dashed-line view). The shown array comprises 15 unit cells. In other embodiments there may be many hundreds, thousands or millions of unit cells formed across a single semiconductor chip. The unit cells are in data communication with processor 32 through circuitry 122. Accordingly, information obtained by the individual unit cells may be processed by the processor 32 and then utilized for any desired purpose, such as, for example, ascertaining if an analyzed sample meets expected quality.

The Rutherford backscattering systems may be utilized for analyzing samples by providing the systems proximate the samples. Such provision may comprise moving the integrated chip comprising the Rutherford backscattering systems into proximity with a sample, and/or moving the sample into proximity with such integrated circuit chip.

FIG. 10 shows an apparatus 150 comprising an integrated circuit chip 10 proximate a sample 152. The integrated circuit chip 10 may be of the type described with reference to FIGS. 1, 2 and 9, and accordingly may comprise an array of Rutherford backscattering system unit cells 20 (diagrammatically illustrated in FIG. 10, and shown separated from one another by boundaries 151).

The chip 10 comprises peripheral regions 156 along edges around the array of the unit cells 20. Projections 158 are associated with the integrated circuit chip 10, and may, for example, comprise materials bonded to the chip. The materials of the projections may be semi-solid materials (for instance, various gels, rubbers, plastics or glasses) that can form an airtight seal against a surface of sample 152. The projections are configured so that a gap (or space) 159 is between an upper surface of sample 152 and a lower surface of a portion of the chip 10 directly over the sample. The projections are shown placed against a surface of the sample. In other embodiments the projections may placed against a surface proximate the sample.

An opening 160 extends through one of the peripheral regions 156. Such opening may be connected to a vacuum system 162 so that a pressure within gap 159 may be reduced to below atmospheric pressure during Rutherford backscattering analysis of a surface of sample 152. Such reduction in pressure may reduce collisions of alpha particles with gas molecules in the gap 159 to reduce errors in determining velocity and direction of backscattered alpha particles and/or to reduce energy loss of alpha particles directed toward the sample.

The sample of FIG. 10 may be anything which is desired to be analyzed by Rutherford backscattering, and in some embodiments may be a semiconductor chip. The compact Rutherford backscattering systems formed in accordance with some embodiments may be particularly suitable for backscattering analysis of semiconductor chips in that they may be produced relatively inexpensively, and utilized in a small space.

FIG. 10 illustrates an embodiment in which low pressure may be provided between Rutherford backscattering systems and a sample. In other embodiments, the opening 160 and/or vacuum system 162 may be omitted, so that a pressure within gap 159 is atmospheric pressure. Also, although chip 10 is described as having projections 158 associated therewith, in other embodiments the chip and sample may be provided within a holder to maintain a desired distance between the chip and sample so that projections 158 may be omitted.

Although a single chip 10 is shown in the embodiment of FIG. 10 for Rutherford backscattering analysis of a sample, in other embodiments multiple chips may be simultaneously utilized for Rutherford backscattering analysis of a sample, or of multiple samples.

The Rutherford backscattering systems of FIGS. 1-6 may be formed by any suitable processing. FIGS. 11-14 illustrate an example process for forming an example system 20 of the type described in FIGS. 1 and 2.

Referring to FIG. 11, a semiconductor base 12 is provided. Such base may comprise monocrystalline silicon, and may have integrated circuitry (not shown) associated therewith.

Referring to FIG. 12, shield material is deposited over base 12 to form shield 26. The shield material may be deposited utilizing any suitable method, including, for example, sputter deposition of gold and or platinum. The shield material may be patterned into the shown configuration utilizing a photolithographically patterned photoresist mask (not shown) and one or more etches of the shield material. The shield material comprises a receptacle 27 for alpha particle emitter material.

Figure 13:
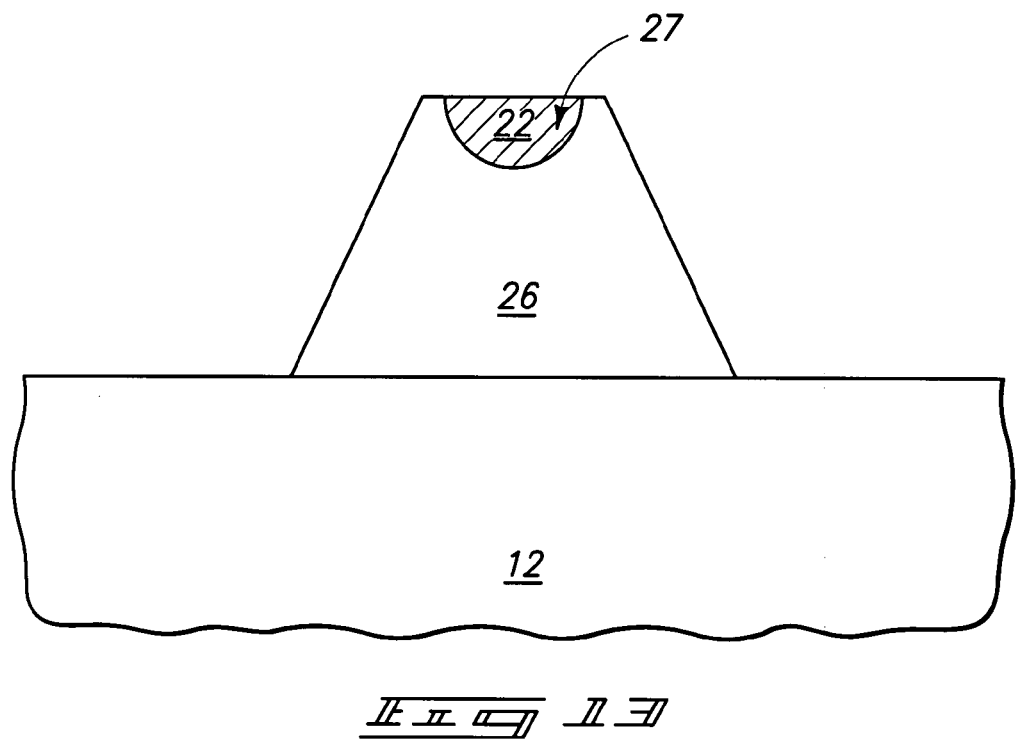

Referring to FIG. 13, alpha emitter material is deposited within the receptacle 27 of the shield material to form the emitter 22. The alpha emitter material may be deposited with any suitable processing, including, for example, sputter deposition. The alpha emitter material may be patterned into the shown configuration utilizing a photolithographically patterned photoresist mask (not shown).

Figure 14:
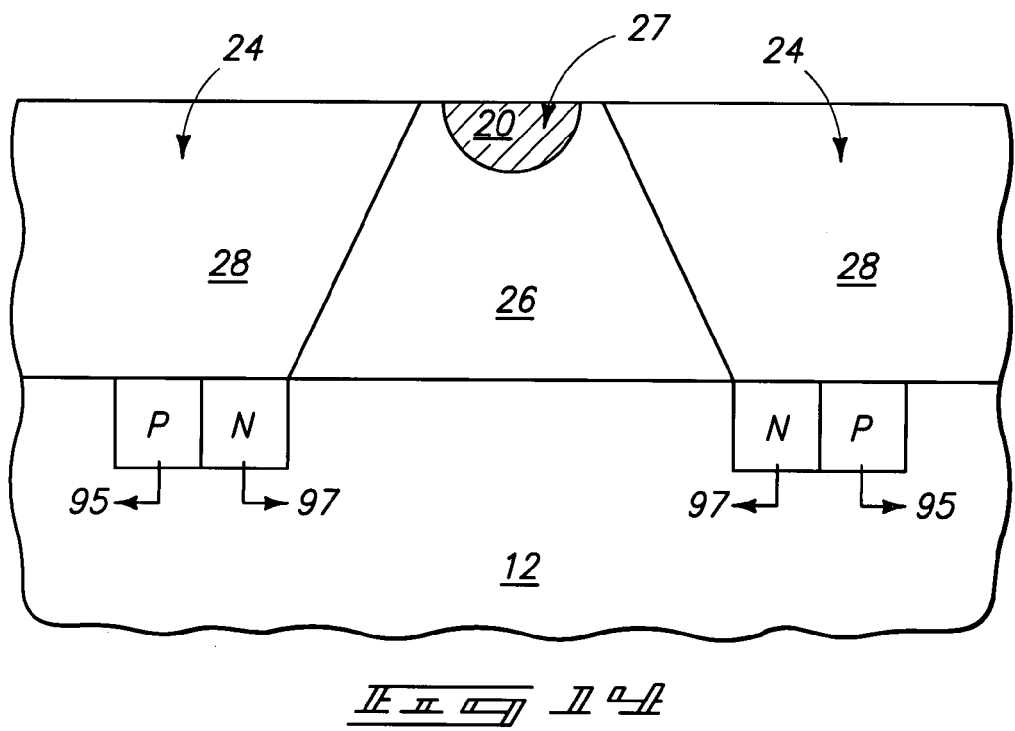

Referring to FIG. 14, alpha particle detectors 24 corresponding to P/N junctions 89 are formed proximate shield 26, and fill material 28 is formed over the detectors. The P/N junctions may be formed utilizing implanting of desired dopants and photolithographic masking.

Although the detectors 24 are shown formed after the shield 26 and emitter 22, in other embodiments at least portions of the detectors may be formed before one or both of the shield 26 and emitter 22.

In subsequent processing, openings may be formed through base 12, and interconnects 30 (FIG. 2) may be formed within the openings to correspond to the electrical interconnects 95 and 97. Alternatively, the interconnects may be formed before formation of one or more of shield 26, emitter 22 and detectors 24. In optional subsequent processing, magnetic lens material may be formed proximate the emitter 22 to form a magnetic lens (for instance, a lens similar to the lens 62 of FIGS. 3 and 4).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated circuit chip, comprising:
a semiconductor substrate;
an alpha particle emitter supported by the substrate;
an alpha particle detector supported by the substrate; and
wherein the alpha particle emitter comprises one or both of radium and americium.

2. An integrated circuit chip, comprising:
a semiconductor substrate;
an alpha particle emitter supported by the substrate;
an alpha particle detector supported by the substrate; and
a magnetic lens supported by the substrate and configured for focusing alpha particles emitted from the emitter.

3. An integrated circuit chip, comprising:
a semiconductor substrate;
an alpha particle emitter supported by the substrate;
an alpha particle detector supported by the substrate; and
shielding between the alpha particle emitter and the alpha particle detector.

4. The integrated circuit chip of claim 3 wherein the shielding comprises one or both of platinum and gold.

5. The integrated circuit chip of claim 3 wherein the shielding consists of gold.

6. The integrated circuit chip of claim 3 wherein the alpha particle emitter, alpha particle detector, and shielding are together comprised by a unit cell; and wherein the unit cell comprises a plurality of detectors and a single emitter.

7. The integrated circuit chip of claim 3 wherein the alpha particle emitter, alpha particle detector, and shielding are together comprised by a unit cell; and wherein the unit cell comprises an emitter surrounding a detector.

8. The integrated circuit chip of claim 3 wherein the alpha particle emitter, alpha particle detector, and shielding are together comprised by a unit cell consuming an area of semiconductor real estate of less than or equal to about 20 microns$^2$.

9. The integrated circuit chip of claim 8 wherein the unit cell is radially symmetric.

10. The integrated circuit chip of claim 8 wherein the consumed area of semiconductor real estate is less than or equal to about 10 microns$^2$.

11. (The integrated circuit chip of claim 8 comprising an array of the unit cells.

12. An apparatus for obtaining backscatter data from a sample, comprising:
an alpha particle emission and detection system configured to obtain backscatter data from the sample, the alpha particle emission and detection system comprising an integrated circuit chip that includes a semiconductor substrate supporting an alpha particle emitter and an alpha particle detector; the integrated circuit chip having a projection associated therewith; the projection being configured to be against a surface of the sample or a surface proximate the sample, and to space the alpha particle detector and emitter over the sample to leave a gap between the sample and a portion of the integrated circuit chip over the sample; and
a vacuum system configured to reduce a pressure within the gap to less than atmospheric pressure.

13. The apparatus of claim 12 wherein alpha particle emission and detection system includes shielding between the alpha particle emitter and the alpha particle detector.

14. The apparatus of claim 13 wherein the shielding comprises one or both of platinum and gold.

15. The apparatus of claim 13 wherein the alpha particle emitter, alpha particle detector, and shielding are together comprised by a unit cell; and wherein the integrated circuit chip comprises an array of the unit cells.

16. The apparatus of claim 13 wherein the alpha particle emitter, alpha particle detector, and shielding are together comprised by a unit cell having a total area along a maximal cross-section of less than about 20 microns$^2$.

17. A method of forming an alpha particle emission and detection system, comprising:
forming shielding material over a semiconductor substrate, the shielding material having a receptacle therein;
forming alpha particle emitter material within the receptacle; and
forming at least one alpha particle sensor over the semiconductor substrate, the shielding material being between the at least one sensor and the emitter material.

18. The method of claim 17 wherein the forming the shielding material comprises deposition of one or both of platinum and gold.

19. The method of claim 17 wherein the forming the alpha particle emitter material comprises deposition of one or both of radium and americium.

20. The method of claim 17 wherein the forming the at least one alpha particle sensor comprises formation of a P/N junction.

21. The method of claim 17 wherein the forming the at least one alpha particle sensor comprises formation of a PIN-type device.

22. The method of claim 17 wherein one or more of the alpha particle sensors are formed before the shielding is formed.

23. The method of claim 17 wherein one or more of the alpha particle sensors are formed after the shielding is formed.

24. A method of backscatter analysis, comprising:
placing a sample proximate an alpha particle emission and detection system, the alpha particle emission and detection system comprising at least one integrated circuit chip that includes a semiconductor substrate supporting an alpha particle emitter and an alpha particle sensor;
emitting alpha particles from the alpha particle emitter toward the sample, some of the alpha particles being backscattered by the sample;
detecting the backscattered alpha particles with the alpha particle sensor;
transferring information regarding the backscattered particles from the sensor to a processor; and
processing the information with the processor.

25. The method of claim 24 wherein the sample comprises a semiconductor substrate.

26. The method of claim 24 wherein the placing of the sample comprises movement of the sample into proximity to the alpha particle emission and detection system.

27. The method of claim 24 wherein the placing of the sample comprises movement of the alpha particle emission and detection system into proximity with the sample.

28. The method of claim 24 wherein the placing of the sample comprises placement of the sample beneath an integrated circuit chip comprising an alpha particle emission and detection system to leave a gap between the sample and the integrated circuit chip, and further comprising reducing a pressure within the gap to below atmospheric pressure prior to the emitting and detecting.

29. The method of claim 24 wherein the processor is comprised by integrated circuitry of the integrated circuit chip.

30. The method of claim 24 wherein the processor is separate from the integrated circuit chip.

31. The method of claim 24 wherein alpha particle emission and detection system includes shielding between the alpha particle emitter and the alpha particle sensor.

32. The method of claim 31 wherein the shielding comprises one or both of platinum and gold.

\* \* \* \* \*

UNITED STATES PATENT AND TRADEMARK OFFICE
CERTIFICATE OF CORRECTION

PATENT NO.       : 7,557,345 B2
APPLICATION NO.  : 11/787852
DATED            : July 7, 2009
INVENTOR(S)      : Mark Williamson et al.

It is certified that error appears in the above-identified patent and that said Letters Patent is hereby corrected as shown below:

In column 7, line 54, in Claim 11, delete "(The" and insert -- The --, therefor.

Signed and Sealed this

Eighteenth Day of August, 2009

David J. Kappos
*Director of the United States Patent and Trademark Office*